United States Patent
Kitahara

(10) Patent No.: US 10,595,449 B2
(45) Date of Patent: Mar. 17, 2020

(54) ELECTROMAGNETIC SHIELDING DEVICE AND WIRE HARNESS

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventor: Yuta Kitahara, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 16/095,824

(22) PCT Filed: Apr. 21, 2017

(86) PCT No.: PCT/JP2017/016033
§ 371 (c)(1),
(2) Date: Oct. 23, 2018

(87) PCT Pub. No.: WO2017/188148
PCT Pub. Date: Nov. 2, 2017

(65) Prior Publication Data
US 2019/0320559 A1 Oct. 17, 2019

(30) Foreign Application Priority Data
Apr. 28, 2016 (JP) ................ 2016-090490

(51) Int. Cl.
*H05K 9/00* (2006.01)
*B60R 16/02* (2006.01)
(Continued)

(52) U.S. Cl.
CPC ....... *H05K 9/0007* (2013.01); *B60R 16/0215* (2013.01); *H01B 7/0045* (2013.01);
(Continued)

(58) Field of Classification Search
USPC ....................................... 361/818
See application file for complete search history.

(56) References Cited

U.S. PATENT DOCUMENTS

2003/0119351 A1* 6/2003 Miyazaki ............... H01R 9/032
439/271
2015/0027772 A1* 1/2015 Hashimoto ......... B60R 16/0215
174/382
2016/0380390 A1 12/2016 Kusamaki et al.

FOREIGN PATENT DOCUMENTS

JP 2012-222888 A 11/2012
JP 2013-176279 A 9/2013
(Continued)

OTHER PUBLICATIONS

Aug. 1, 2017 International Search Report issued in International Patent Application No. PCT/JP2017/016033.

*Primary Examiner* — Hung S. Bui
(74) *Attorney, Agent, or Firm* — Oliff PLC

(57) ABSTRACT

An electromagnetic shielding device, where the electromagnetic shielding device includes a metal sheet; and a pair of brackets that are formed of a conductive material, and that annularly retain a first outer edge out of four outer edges of the metal sheet, and a second outer edge located opposite to the first outer edge.

8 Claims, 3 Drawing Sheets

(51) Int. Cl.
　　　*H01B 7/00*　　　　(2006.01)
　　　*H01R 4/18*　　　　(2006.01)
　　　*H01R 13/6593*　　(2011.01)
　　　*H02G 3/04*　　　　(2006.01)

(52) U.S. Cl.
　　　CPC ........... *H01R 4/18* (2013.01); *H01R 13/6593* (2013.01); *H02G 3/0462* (2013.01); *H01R 2201/26* (2013.01)

(56) References Cited

FOREIGN PATENT DOCUMENTS

| | | |
|---|---|---|
| JP | 2014-123623 A | 7/2014 |
| JP | 2015-153591 A | 8/2015 |

\* cited by examiner

ELECTROMAGNETIC SHIELDING DEVICE AND WIRE HARNESS

This application is the U.S. National Phase of PCT/JP2017/016033 filed Apr. 21, 2017, which claims priority from JP 2016-090490 filed Apr. 28, 2016, the entire disclosure of which is incorporated herein by reference.

BACKGROUND

The present disclosure relates to an electromagnetic shielding device that shields noise electromagnetic waves, and a wire harness including the same.

JP 2013-176279A discloses an electromagnetic shielding device that shields electromagnetic noise by surrounding a plurality of wires with a metal cloth. The electromagnetic shielding device includes two brackets that annularly retain a first outer edge portion of the metal cloth and a second outer edge portion located opposite thereto.

SUMMARY

Meanwhile, for the electromagnetic shielding device of JP 2013-176279A, the metal cloth is joined to two long portions included in the brackets by crimping or welding. However, the two long portions may not be able to provide sufficient joining strength. For this reason, it may be difficult to maintain the shape of the metal cloth, thus possibly reducing the noise absorption performance.

An exemplary aspect of the disclosure provides a technique for facilitating the maintenance of the shape of a metal sheet in an electromagnetic shielding device.

In order to solve the above-described problems, a first aspect is directed to an electromagnetic shielding device including: a metal sheet; and a pair of brackets that are formed of a conductive material, and that annularly retain a first outer edge out of four outer edges of the metal sheet, and a second outer edge located opposite to the first outer edge, wherein each bracket of the pair of brackets includes a first long portion, a first short portion, a second long portion, and a second short portion that are arranged in series along each of the first outer edge and the second outer edge, the first long portion, the first short portion, and the second long portion are joined to the metal sheet, each of the first short portion and the second short portion is shorter than each of the first long portion and the second long portion, opposite ends of the first short portion are continuous with the first long portion and the second long portion, respectively, via bending portions, one of the opposite ends of the second short portion is continuous with the second long portion via a bending portion, and the other end is coupled to the first long portion via a coupler, the coupler is a portion extending outwardly from the other end of the second short portion, and the other end of the second short portion is eccentrically located at a position closer to the first long portion than to the second long portion.

A second aspect is directed to the electromagnetic shielding device according to the first aspect, wherein the coupler includes: a first coupling piece that is continuous with the first long portion, and that is formed in a plate shape expanding parallel to a principal surface of the first long portion; and a second coupling piece that is continuous with the second short portion, and that is formed in a plate shape expanding perpendicularly to the second short portion.

A third aspect is directed to the electromagnetic shielding device according to the first or second aspect, wherein the second short portion is connected to the metal sheet.

A fourth aspect is directed to an electromagnetic shielding device including: a metal sheet; and a pair of brackets that are formed of a conductive material, and that annularly retain a first outer edge out of four outer edges of the metal sheet, and a second outer edge located opposite to the first outer edge, wherein each bracket of the pair of brackets includes a first long portion, a first short portion, a second long portion, a second short portion, and a third short portion that are arranged in series along each of the first outer edge and the second outer edge of the metal sheet, the first long portion, the first short portion, and the second long portion are joined to the metal sheet, each of the first short portion, the second short portion, and the third short portion is shorter than each of the first long portion and the second long portion, opposite ends of the first short portion are continuous with the first long portion and the second long portion, respectively, via bending portions, one of opposite ends of the second short portion is continuous with the second long portion via a first bending portion, and the other end is coupled to one end of the third short portion via a coupler and another end of the third short portion is continuous with the first long portion via a second bending portion.

A fifth aspect is directed to the electromagnetic shielding device according to any one of the first to fourth aspects, wherein each of the bending portions between the first and second long portions and the first short portion is a portion that is not joined to the metal sheet.

A sixth aspect is directed to the electromagnetic shielding device according to any one of the first to fifth aspects, wherein the first long portion, the second long portion, and the first short portion each have a base and a folded-back portion that is continuous with the base, and the metal sheet is sandwiched and retained between the base and the folded-back portion.

A seventh aspect is directed to a wire hireness including the electromagnetic shielding device according to any one of the first to sixth aspects, and a wire inserted through the electromagnetic shielding device.

An eighth aspect is directed to the wire harness according to the seventh aspect, wherein the number of the wires inserted through the electromagnetic shielding device is a multiple of 3.

With the electromagnetic shielding device according to the first aspect, in addition to the first long portion and the second long portion, the first short portion connecting these portions is also joined to the metal sheet. This makes it possible to firmly attach the brackets to the metal sheet. Accordingly, the shape maintenance of the metal sheet is facilitated, thus making it possible to prevent the reduction of the noise absorption performance. Then, by elongating a portion extending from one end to the other end of the second short portion such that the other end of the second short portion is eccentrically located at a position closer to the first long portion, it is possible to elongate the region that is to be joined to the metal sheet. This allows the second short portion to be stably joined to the metal sheet.

With the electromagnetic shielding device according to the second aspect, by bending each of the bending portions located between the first long portion, the first short portion, the second long portion, and the second short portion so as to cause the first coupling piece and the second coupling piece to overlap substantially parallel to each other, the first outer edge or the second outer edge of the metal sheet can be formed into an annular shape.

With the electromagnetic shielding device according to the third aspect, by joining another short portion, which is the second short portion connecting the first long portion and the second long portion, to the metal sheet, it is possible to firmly attach the brackets to the metal sheet.

With the electromagnetic shielding device according to the fourth aspect, in addition to the first long portion and the second long portion, the first short portion connecting these portions is also joined to the metal sheet. This allows the brackets to be firmly attached to the metal sheet. Accordingly, the shape maintenance of the metal sheet is facilitated, thus making it possible to prevent the reduction of the noise absorption performance.

With the electromagnetic shielding device according to the fifth aspect, the metal sheet is not joined to each of the bending portions, and, therefore, the metal sheet joined to the brackets can be suppressed from receiving a stress from the bending portions during bending of the brackets. Accordingly, it is possible to reduce a damage such as peeling or tearing of the metal sheet.

With the electromagnetic shielding device according to the sixth aspect, the metal sheet can be clamped by bending the folded-back portions such that the folded-back portions approach the base portion. Accordingly, it is possible to easily join the metal sheet to the first long portion, the second long portion, and the first short portion.

With the wire harness according to the second aspect, in addition to the first long portion and the second long portion, the first short portion connecting these portions is also joined to the metal sheet. This allows the brackets to be firmly attached to the metal sheet. Accordingly, the shape maintenance of the metal sheet is facilitated, thus making it possible to prevent the reduction of the noise absorption performance. Therefore, it is possible to suitably shield the electromagnetic noise from the wire.

DETAILED DESCRIPTION OF EMBODIMENTS

1. Embodiment 1

Figure 1:
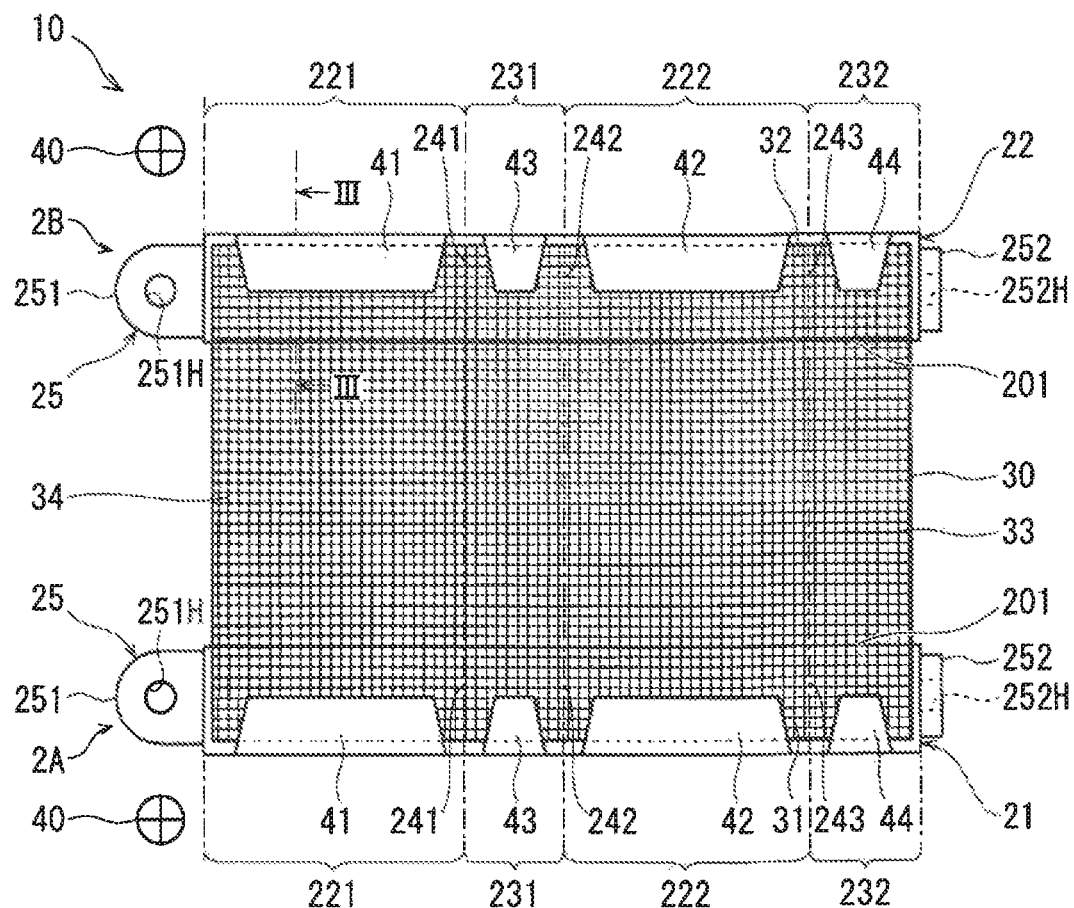
FIG. 1 is a plan view of an electromagnetic shielding device according to Embodiment 1.
Figure 2:
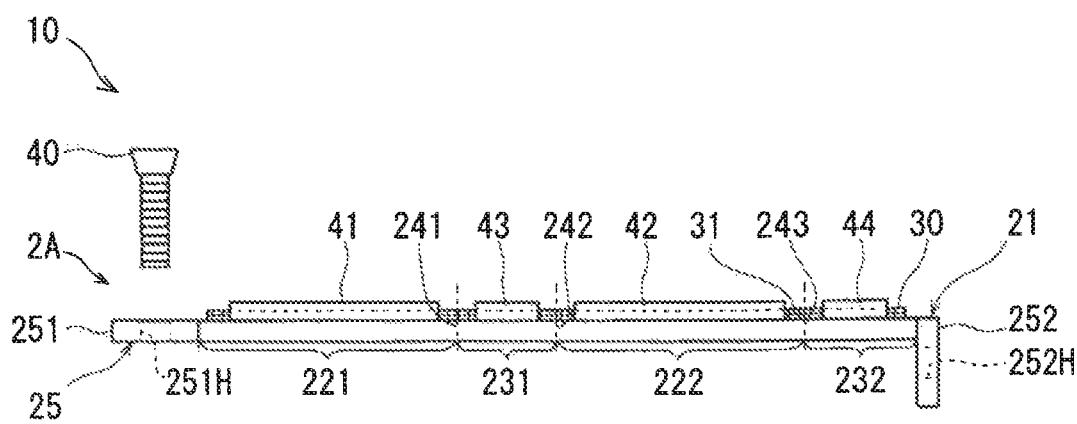
FIG. 2 is a front view of the electromagnetic shielding device according to Embodiment 1.
Figure 3:
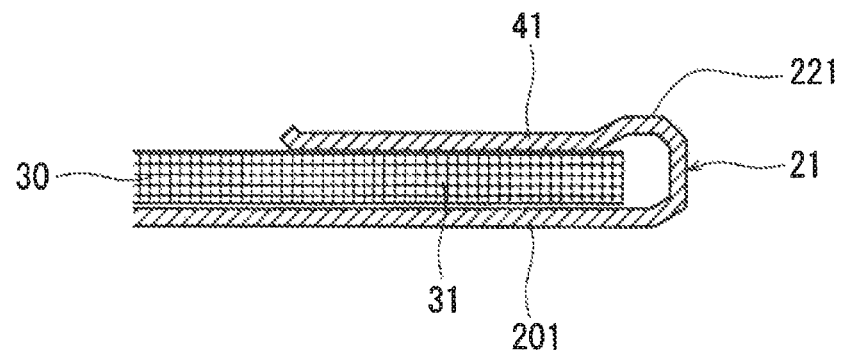
FIG. 3 is a cross-sectional view of a joining portion (crimping portion) between a long portion and a metal sheet in the electromagnetic shielding device.
Figure 4:
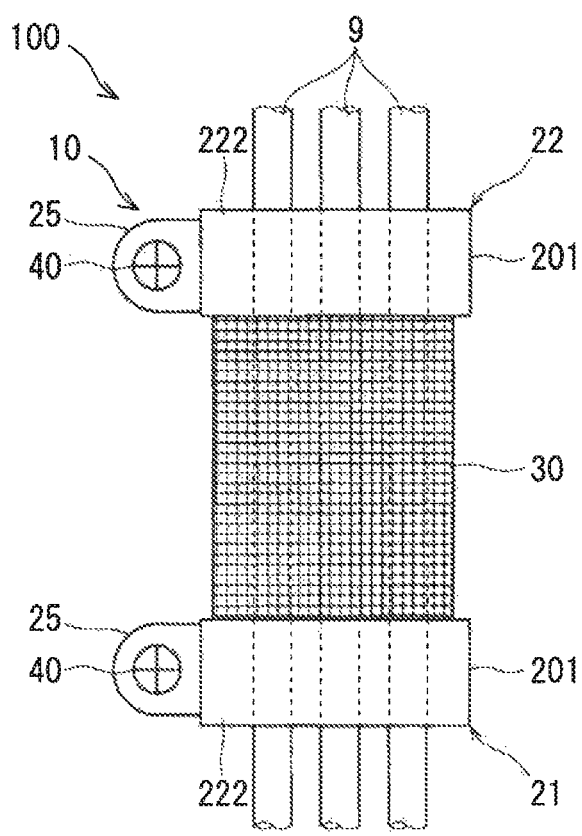
FIG. 4 is a plan view of a wire harness according to Embodiment 1.
Figure 5:
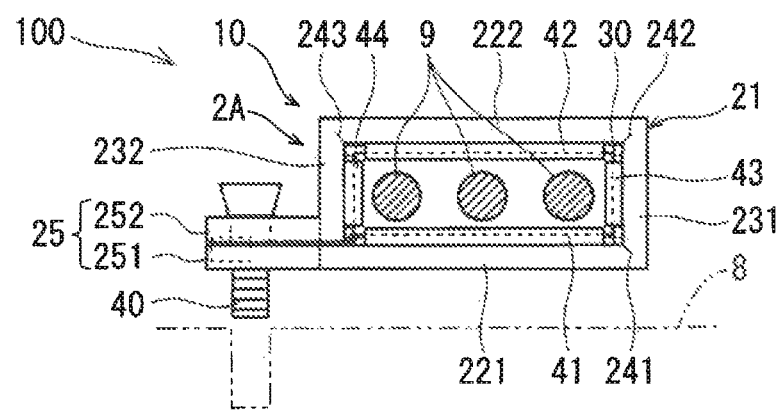
FIG. 5 is a front view of the wire harness according to Embodiment 1.

FIG. 1 is a plan view of an electromagnetic shielding device 10 according to Embodiment 1. FIG. 2 is a front view of the electromagnetic shielding device 10 according to Embodiment 1. FIG. 3 is a cross-sectional view of a joining portion (crimping portion) where a long portion 221 is joined to a metal sheet 30 in the electromagnetic shielding device 10. FIG. 4 is a plan view of a wire harness 100 according to Embodiment 1. FIG. 5 is a front view of the wire harness 100 according to Embodiment 1. The electromagnetic shielding device 10 shown in FIGS. 1 and 2 is in a developed state, and the electromagnetic shielding device 10 shown in FIGS. 4 and 5 is in an annually retained state.

The electromagnetic shielding device 10 is a component that is to be attached to the wires of a wire harness mounted to a vehicle, and that shields noise electromagnetic waves by using a conductive metal sheet (metal sheet 30) surrounding the wires.

The electromagnetic shielding device 10 includes a pair of main bracket portions 21 and 22, a metal sheet 30, and a pair of screws 40 serving as fixing devices. The metal sheet 30 is joined to each of the main bracket portions 21 and 22. The pair of screws 40 are fixing devices for annularly retaining the respective corresponding main bracket portions 21 and 22.

The pair of brackets body portions 21 and 22 and the pair of screws 40 constitute a pair of brackets 2A and 2B. That is, the electromagnetic shielding device 10 includes the pair of brackets 2A and 2B.

As shown in FIG. 5, the bracket 2A is fixed to a metal casing (casing 8) of a device to which one end of a wire 9 is to be connected, and the bracket 2B is fixed to a casing of a device to which the other end of the wire 9 is to be connected.

As shown in FIGS. 4 and 5, the wire harness 100 includes a plurality of (here, three) wires 9, and an electromagnetic shielding device 10 that collectively covers around the plurality of wires 9. The wire harness 100 includes a tubular electromagnetic shielding device 10, and a plurality of wires 9 inserted through the tubular electromagnetic shielding device 10. Note that it is also conceivable that the electromagnetic shielding device 10 of the wire harness 100 covers only one wire 9. It is also conceivable that the electromagnetic shielding device 10 covers the number of wires that is a multiple of 3 (3, 6, 9 . . . ).

Wire

Each wire 9 is an insulated wire composed of a core wire made of a conductive material, and an insulating coating made of an insulating material and covering around the core wire. Ordinarily, a metal terminal (not shown) is connected to the core wire at an end portion of the wire 9. Note that the wire 9 may be retained by a wire retaining member (not shown). It is conceivable that such a wire retaining member is a thermoplastic resin member molded by insert molding with the wire 9 as an insert portion.

Metal Sheet

The metal sheet 30 of the electromagnetic shielding device 10 is a sheet-like member that is a woven fabric of metal yarns. The metal sheet 30 is a metal cloth having a stich structure formed, for example, by weaving yarns of a metal composed mainly of a conductive metal (e.g., copper) such that the yarns intersect longitudinally and transversely. Note that it is preferable that the metal sheet 30 has flexibility attributed to a resin material attached to the metal cloth. The electromagnetic shielding device 10 may include a metal foil in place of the metal cloth as the metal sheet 30. The metal sheet 30 has conductivity and flexibility.

In the following description, four outer edges of the metal sheet 30 are referred to as a first outer edge portion 31, a second outer edge portion 32, a third outer edge portion 33, and a fourth outer edge portion 34 (i.e., outer edges), respectively.

The first outer edge portion 31 is a portion occupying a predetermined range extending inwardly from an outer edge constituting one end in the longitudinal direction (axial direction) of a wire 9 to which it is to be attached, among the four outer edges of the metal sheet 30. The second outer edge portion 32 is a portion occupying a predetermined range extending inwardly from the outer edge located opposite to the first outer edge portion 31, among the four outer edges of the metal sheet 30.

The third outer edge portion 33 and the fourth outer edge portion 34 are the other outer edge portions of the metal sheet 30 that are not the first outer edge portion 31 or the second outer edge portion 32. The third outer edge portion 33 and the fourth outer edge portion 34 are outer edge portions at the other ends, surrounding the wire 9 of the metal sheet 30.

In the electromagnetic shielding device 10, the metal sheet 30 is joined to the main bracket portion 21 at the first outer edge portion 31. The metal sheet 30 is joined to the main bracket portion 22 at the second outer edge portion 32. The metal sheet 30 is electrically connected to a casing 8 of another device via the pair of brackets 2A and 2B, thus providing a casing ground.

Bracket

The main bracket portions 21 and 22 are plate-shaped members formed of a conductive material. The main bracket portions 21 and 22 are formed in an annular shape as shown in FIGS. 4 and 5 by bending.

The main bracket portions 21 and 22 are members made of, for example, a metal such as a copper alloy, iron, or stainless steel, and have a plated layer formed on the surface thereof as needed. The main bracket portions 21 and 22 are members that are to be fixed to a metal casing 8, and that relay electrical connection between the metal sheet 30 and the casing 8.

The shapes of the main bracket portions 21 and 22 are mirror images of each other, and, therefore, the structure of only the main bracket portion 21 will be described in the following.

The main bracket portion 21 includes a plate-shaped base portion 201 extending along the first outer edge portion 31 of the metal sheet 30. By folding over the base portion 201 at three locations (bending portions 241, 242, and 243), the main bracket portion 21 is formed to an annular shape (a substantially quadrangular tubular shape) (see FIG. 5). The base portion 201 is divided into a pair of long portions 221 and 222 and a pair of short portions 231 and 232 by the three bending portions 241, 242, and 243.

Long Portion

The pair of long portions 221 and 222 are portions that are to be placed so as to span across a plurality of wires 9 to be shielded. Here, the pair of long portions 221 and 222 have substantially the same length. In the annular main bracket portions 21 and 22, the pair of long portions 221 and 222 are opposed and extend parallel to each other. However, the shape and the length of the pair of long portions 221 and 222 are not limited thereto, and vary depending on the arrangement status of the plurality of wires 9, the shape of the wire retaining member, or the like. For example, the long portion 221 and 222 may have a nonlinear shape, such as a shape having a portion that can be bent in an arc shape.

The pair of long portions 221 and 222 are joined to the metal sheet 30 in a state in which they are arranged in series along the first outer edge portion 31. The metal sheet 30 and the pair of long portions 221 and 222 are joined together, for example, by crimping or welding, or both. As will be described later, joining by crimping is used here. The pair of long portions 221 and 222 of the body portion 21 are joined to the first outer edge portion 31, and the pair of long portions 221 and 222 of the main bracket portion 22 are joined to the second outer edge portion 32.

The pair of long portions 221 and 222 respectively include plate-shaped folded-back portions 41 and 42 each of which is coupled to the base portion 201 at one end. By crimping the folded-back portions 41 and 42 to the base portion 20 with the metal sheet 30 sandwiched therebetween, the metal sheet 30 is clamped by the base portion 201 and the folded-back portions 41 and 42 (see FIG. 3).

Short Portion

The pair of short portions 231 and 232 are joined to the metal sheet 30 in a state in which they are arranged in series along the first outer edge portion 31. Each of the pair of short portions 231 and 232 is shorter than each of the pair of long portions 221 and 222. A first end of the short portion 231 is continuous with a second end of the long portion 221 via the bending portion 241, and a second end of the short portion 231 is continuous with a first end of the long portion 222 via the bending portion 242. A first end of the short portion 232 is continuous with a second end of the long portion 222 via the bending portion 243. Here, the pair of short portions 231 and 232 have the substantially the same length. In the annular main bracket portion 21, the pair of short portions 231 and 232 are opposed so as to extend parallel to each other. However, the shape and the length of the pair of short portions 231 and 232 are not limited thereto, and vary depending on the arrangement status of the plurality of wires 9, the shape of the wire retaining member, or the like.

The pair of short portions 231 and 232 respectively include plate-shaped folded-back portions 43 and 44 each of which is coupled to the base portion 201 at one end. By crimping the folded-back portions 43 and 44 to the base portion 201 with the metal sheet 30 sandwiched therebetween, the metal sheet 30 is clamped by the base portion 201 and the folded-back portions 43 and 44.

When the metal sheet 30 is joined to the pair of brackets 2A and 2B by welding, breakage or the like may occur in the metal sheet 30 during welding. Therefore, it is preferable that the metal sheet 30 is joined by crimping the folded-back portions 41 and 44.

Bending Portion

As described above, the three bending portions 241 to 243 are portions that are to be bent in a valley shape at the time of shaping the main bracket portions 21 and 22 into an annular shape. Note that the bending portions 241 to 243 are not necessarily bent so as to be crooked, and also may be bent in an arc shape.

As shown in FIGS. 1, 2, and 5, the bending portions 241 to 243 are positioned so as not to overlap the folded-back portions 41 and 44. In other words, the bending portions 241, 242, and 243 are unjoined portions that are not to be joined to the metal sheet 30. The thickness of the bending portions 241 to 243 is set to be equal to the thickness of the base portion 201, and, therefore, bending can be more easily performed at these portions than at the joined portions (the portions overlapping the bending portions 241 to 243 of the base portion 201).

Here, "join" means attaching or fixing an object to another object by means of crimping, welding, or the like. That is, an unjoined portion is a portion where the metal sheet 30 can be easily separated from the main bracket portions 21 and 22.

By forming the bending portions 241 to 243 as unjointed portions, it is possible to suppress the bending portions 241 to 243 from exerting a stress on the metal sheet 30 when they are bent at these portions. Accordingly, the metal sheet 30 can be annularly retained in a suitable manner by the main bracket portions 21 and 22 that have been bent.

Note that as described above, joining between the main bracket portions 21 and 22 and the metal sheet 30 may be performed by welding. In this case, the folded-back portions 41 and 44 can be omitted. For joining by welding as well, it is preferable that the bending portions 241 to 243 are unjoined portions that are not to be welded. This can suppress the bending portions 241 to 243 from exerting a stress on the metal sheet 30 when they are bent at the bending portions 241 to 243. Accordingly, for example, by bending the main bracket portions 21 and 22, it is possible to suppress the occurrence of a damage such as peeling or tearing at the welded portion (the portion of the metal sheet 30 to which the metal sheet 30 or the main bracket portions 21 and 22 have been bonded by being melted and solidified) of the metal sheet 30.

Coupling Portion

The coupling portion 25 (i.e., coupler) includes coupling pieces 251 and 252 that are formed in plate shapes being continuous with opposite end portions, respectively, of the base portion 201. The coupling piece 251 is continuous with the first end side of the long portion 221 in the base portion 201, and the coupling piece 252 is continuous with the second end side of the short portion 232 of the base portion 201.

As shown in FIGS. 1 and 2, the coupling piece 251 is a plate-shaped portion expanding parallel to a principal surface (a surface that is the widest, and is to be joined to the metal sheet 30) of the base portion 201, and the coupling piece 252 is a plate-shaped portion expanding in a direction perpendicular to the principal surface of the base portion 201. That is, in the main bracket portions 21 and 22 in the developed state, the coupling pieces 251 and 252 are plate-shaped portions that are orthogonal to each other. When the base portion 201 has been bent at the three bending portions 241 to 243, the coupling piece 252 becomes substantially parallel to the coupling piece 251, and overlaps therewith, as shown in FIG. 5. Consequently, the main bracket portions 21 and 22 are formed into an annular shape, thus forming the first outer edge portion 31 and the second outer edge portion 32 of the metal sheet 30 into an annular shape.

Screw holes 251H and 252H as through holes are formed in the coupling pieces 251 and 252. In the main bracket portions 21 and 22 in the annular state, the coupling pieces 251 and 252 are caused to overlap with each other, and, thereby, the screw holes 251H and 252H vertically overlap. By fitting a screw 40 to screw holes 251H and 252H in this state, the coupling pieces 251 and 252 are coupled. Consequently, the opposite ends (i.e., the first end of the long portion 221 and the second end of the short portion 232) of the base portion 201 are coupled via the coupling portion 25, and the main bracket portions 21 and 22 are annularly retained.

In the brackets 2A and 2B, the coupling portion 25 including the coupling pieces 251 and 252 and the screw 40 are an example of the coupling portion. Note, however, that the coupling portion is not limited to the configuration including the coupling pieces 251 and 252 and the screw 40, and design modification may be made thereto as necessary. For example, the coupling pieces 251 and 252 may not be necessarily coupled using the screw 40, and may be coupled by another method (e.g., fitting, welding, an adhesive, tape, or crimping).

In the pair of brackets 2A and 2B in the annular state, the coupling portion 25 may not necessarily extend parallel to the base portion 201, and the coupling portion 25 may extend in a direction inclined relative to the base portion 201.

When the brackets 2A and 2B have been annularly retained, the metal sheet 30 that has been joined to the main bracket portion 21 and the main bracket portion 22 is retained in a tubular shape surrounding the wires 9.

In the annular brackets 2A and 2B, the coupling piece 252 of the coupling portion 25 is a portion extending outwardly from the second end of the short portion 232 (the second short portion). Then, the second end (i.e., the bending portion that is continuous with the coupling piece 252) of the short portion 232 is eccentrically located at a position closer to the long portion 221 (first long portion) than to the long portion 222 (second long portion). Thus, by elongating a portion extending from the first end to the second end of the short portion 232, the region (joining surface) of the short portion 232 that is to be joined to the metal sheet 30 can be made as long as possible. This can increase the length of the folded-back portion 44, thus making it possible to more firmly join the metal sheet 30 to the brackets 2A and 2B.

With the electromagnetic shielding device 10, in addition to the pair of long portions 221 and 222, the short portion 231 connecting these portions is also joined to the metal sheet 30, thus making it possible to firmly attach the pair of brackets 2A and 2B to the metal sheet 30.

Furthermore, the short portion 232 that couples the pair of long portions 221 and 222 via the coupling portion 25 is also joined to the metal sheet 30, thus making it possible to firmly attach the pair of brackets 2A and 2B to the metal sheet 30.

By firmly attaching the metal sheet 30 to the pair of brackets 2A and 2B, it is possible to suppress the metal sheet 30 from losing its shape. This can prevent the reduction of the noise absorption performance of the electromagnetic shielding device 10.

Note that in the above-described embodiment, each of the main bracket portions 21 and 22 is constituted by one plate-shaped member. However, it is conceivable that they are constituted by a combination of a plurality of members. For example, it is conceivable that the long portion 221 and the short portion 231 are included in one member, the long portion 222 and the short portion 232 are included in one member, and these members are combined. It is also conceivable that the long portion 221, the long portion 222, the short portion 231, and the short portion 232 are formed as members separate from each other, and these members are combined.

2. Embodiment 2

Next, Embodiment 2 will be described. Note that in the following description, elements having the same functions as the elements already described are denoted by the same reference numerals or reference numerals with letters of alphabets added thereto, and the detailed description thereof may be omitted.

Figure 6:
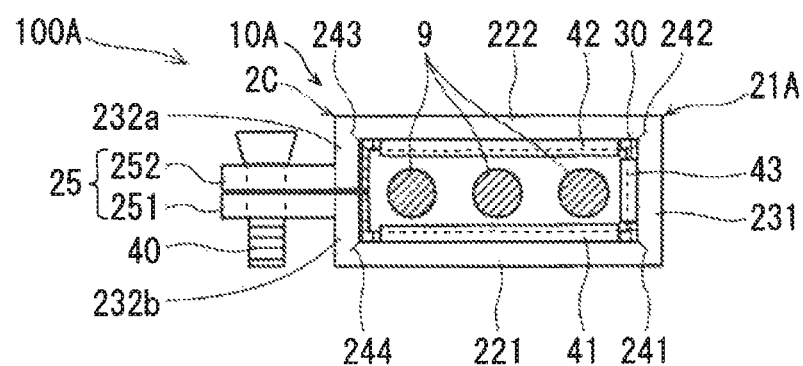
FIG. 6 is a front view of a wire harness including an electromagnetic shielding device according to Embodiment 2.

FIG. 6 is a front view of a wire harness 100A including an electromagnetic shielding device 10A according to Embodiment 2. The electromagnetic shielding device 10A includes a bracket 2C including a main bracket portion 21A. The main bracket portion 21A has a configuration similar to that of the main bracket portion 21, but its portion corresponding to the short portion 232 is formed as a short portion 232a (second short portion). The second end side of the short portion 232a is coupled to the long portion 221 via the coupling portion 25 and a short portion 232b (third short portion). The short portion 232b is continuous with the first end side of the long portion 221 via a bending portion 244.

For the present example, the second end of the short portion 232a is set at substantially the center between the long portion 221 and the long portion 222, so that the short portion 232a is shorter than the short portion 232, and the bending portion for being joined to the metal sheet 30 is omitted. Accordingly, the bracket 2C is inferior in joining strength to the bracket 2A in that it is not joined to the metal sheet 30 at the short portion 232a. However, in addition to the pair of long portions 221 and 222, the short portion 231 is also joined to the metal sheet 30, thus making it possible to firmly attach the bracket 2C to the metal sheet 30.

While the present disclosure has been described in detail, the foregoing description is in all aspects illustrative and the disclosure is not limited thereto. It will be appreciated that numerous modifications not illustrated herein can be made without departing from the scope of the present disclosure. In addition, the configurations described in the embodiments and modifications may be combined or omitted as appropriate as long as there are no mutual inconsistencies.

The invention claimed is:

1. An electromagnetic shielding device comprising:
   a metal sheet; and
   a pair of brackets that are formed of a conductive material, and that annularly retain a first outer edge out of four outer edges of the metal sheet, and a second outer edge located opposite to the first outer edge, each bracket of the pair of brackets including:
   a first long portion, a first short portion, a second long portion, and a second short portion that are arranged in series along each of the first outer edge and the second outer edge,
   the first long portion, the first short portion, and the second long portion are joined to the metal sheet,
   each of the first short portion and the second short portion is shorter than each of the first long portion and the second long portion,
   opposite ends of the first short portion are continuous with the first long portion and the second long portion, respectively, via first and second bending portions,
   one of the opposite ends of the second short portion is continuous with the second long portion via a third bending portion, and the other end is coupled to the first long portion via a coupler,
   the first, second and third bending portions being unjoined portions that are not joined to the metal sheet,
   the coupler is a portion extending outwardly from the other end of the second short portion, and
   the other end of the second short portion is eccentrically located at a position closer to the first long portion than to the second long portion.

2. The electromagnetic shielding device according to claim 1, wherein
   the coupler includes:
   a first coupling piece that is continuous with the first long portion, and that is formed in a plate shape expanding parallel to a principal surface of the first long portion; and
   a second coupling piece that is continuous with the second short portion, and that is formed in a plate shape expanding perpendicularly to the second short portion.

3. The electromagnetic shielding device according to claim 1, wherein
   the second short portion is connected to the metal sheet.

4. The electromagnetic shielding device according to claim 1, wherein
   the first long portion, the second long portion, and the first short portion each have a base and a folded-back portion that is continuous with the base, and
   the metal sheet is sandwiched and retained between the base and the folded-back portion.

5. A wire harness comprising:
   the electromagnetic shielding device according to claim 1; and
   a wire inserted through the electromagnetic shielding device.

6. The wire harness according to claim 5, wherein
   the number of the wires inserted through the electromagnetic shielding device is a multiple of 3.

7. The wire harness according to claim 1, wherein
   a thickness of each of the bending portions is equal to a thickness of a base portion of a respective one of the pair of brackets.

8. An electromagnetic shielding device comprising:
   a metal sheet; and
   a pair of brackets that are formed of a conductive material, and that annularly retain a first outer edge out of four outer edges of the metal sheet, and a second outer edge located opposite to the first outer edge, each bracket of the pair of brackets including:
   a first long portion, a first short portion, a second long portion, a second short portion, and a third short portion that are arranged in series along each of the first outer edge and the second outer edge of the metal sheet,
   the first long portion, the first short portion, and the second long portion are joined to the metal sheet,
   each of the first short portion, the second short portion, and the third short portion is shorter than each of the first long portion and the second long portion,
   opposite ends of the first short portion are continuous with the first long portion and the second long portion, respectively, via first and second bending portions,
   one of opposite ends of the second short portion is continuous with the second long portion via a third bending portion, and the other end is coupled to one end of the third short portion via a coupler, and
   another end of the third short portion is continuous with the first long portion via a second bending portion.

* * * * *